Figure 1:
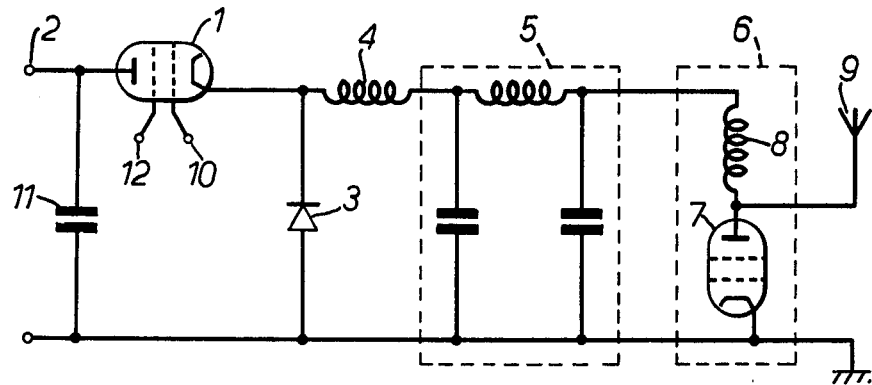

United States Patent [19]

Molyneux-Berry

[11] 4,272,737

[45] Jun. 9, 1981

[54] PULSE WIDTH MODULATOR FOR AMPLITUDE MODULATION CIRCUIT

[75] Inventor: Robert B. Molyneux-Berry, Danbury, England

[73] Assignee: The Marconi Company Limited, Chelmsford, England

[21] Appl. No.: 42,289

[22] Filed: May 25, 1979

[51] Int. Cl.³ .......................... H03C 1/00; H03K 7/08
[52] U.S. Cl. ...................................... 332/1; 332/9 R; 332/31 R; 332/64; 332/67; 375/22; 375/41
[58] Field of Search ................... 332/1, 9 R, 31 R, 64, 332/67; 375/22, 41

[56] References Cited

U.S. PATENT DOCUMENTS 4,118,677  10/1978  Weldon .............................. 332/9 R

FOREIGN PATENT DOCUMENTS 1551711  8/1979  United Kingdom .................. 332/31 R

OTHER PUBLICATIONS

Anon, "PDM Spart Strom", Radio Mentor Electronic, vol. 42, No. 12, p. 482, Dec. 1976.

Primary Examiner—Siegfried H. Grimm
Attorney, Agent, or Firm—Diller, Ramik & Wight

[57] ABSTRACT

A pulse width modulation circuit which uses a tube, such as a tetrode tube as the switching element, is arranged to minimise excessive power dissipation in the screen electrode circuit of the tube. The screen electrode is driven from a constant current source to prevent excessive current being diverted from the cathode to the screen electrode which would otherwise occur when the impedance of the anode circuit rises to a high value.

8 Claims, 6 Drawing Figures

PULSE WIDTH MODULATOR FOR AMPLITUDE MODULATION CIRCUIT

This invention relates to modulation circuits and more specifically to amplitude modulation circuits utilising a pulse width modulator. In order to provide a high efficiency amplitude modulation circuit it has been proposed to use a pulse width modulator which, itself, absorbs relatively little power to produce a digital pulse train having a variable mark-space ratio and to follow it by a low pass filter which derives a variable amplitude waveform from the pulse train.

A gridded tube such as a tetrode valve can be used as an efficient pulse width modulation switch and, while it is rendered conductive, it can pass a large current from its cathode to its anode while absorbing relatively little power itself. If the impedance of the circuitry is such as to prevent this large current, which is emitted from the cathode, from passing to the anode a large proportion of the emitted current is diverted to the screen electrode. This results in an excessive screen current flowing and a consequential excessive power dissipation in the tetrode tube which is unacceptably large.

The present invention seeks to provide an improved modulation circuit in which the screen electrode is driven in a relatively simple and economical manner which avoids excessive dissipation and power in the tetrode tube itself.

According to this invention, a modulation circuit includes a pulse width modulation switch in the form of a switchable tube having a grid electrode to which, in operation, is applied a pulse width modulation control signal, and a screen electrode; means for applying a substantially constant bias current to said screen electrode for those periods while the tube is rendered conductive by the application of a suitable control signal to the grid electrode; and a low pass filter arranged to attenuate frequencies at the switching frequency of said control signal. Preferably, the switchable tube is a tetrode. Preferably, a further switchable device is connected in parallel with a pair of input terminals of said low pass filter, and which is arranged to provide a shunt path for current in the low pass filter while said pulse width modulation switch is non-conductive.

The further switchable device may be a transistor or triode tube, but, preferably, it is also a tetrode tube having a grid electrode to which a signal is applied in anti-phase to the pulse width modulation control signal.

Preferably, the two tetrode tubes have common current source means for providing a bias current for their respective screen electrodes. Preferably, again said common current source means comprises an inductor in series with a source of potential. As each tetrode tube is rendered conductive, alternately, under the action of the respective anti-phase grid control signals, the screen current supplied by the inductance and source of potential (which together act as a substantially constant current generator) is diverted to the screen electrode of whichever tetrode tube is at that instant conductive.

In some cases it may be desirable to provide a resistive impedance in series with said inductance to limit excessive current flow under adverse operating conditions, but normally the intrinsic resistance of the screen electrode circuit and the internal impedance of the source of potential will provide sufficient impedance.

In embodiments of the pulse width modulation system in which the cathode of the switchable tube which comprises the pulse width modulation switch is arranged to be switched between earth potential and an H.T. potential under the action of the pulse width modulation control signal which is applied to the grid electrode of said switchable tube, the grid drive circuit which applies the control signal to the grid electrode is, preferably, electrically isolated from the earth potential by means of an optical coupler.

Preferably again, the optical coupler comprises an electro-optical transducer and an opto-electrical transducer coupled by an electrically insulating optical fibre.

Where, as specified above, two tetrode tubes are provided, preferably the respective grid electrode control signals are derived using a common optical coupler using a common optical fibre path.

Figure 2:
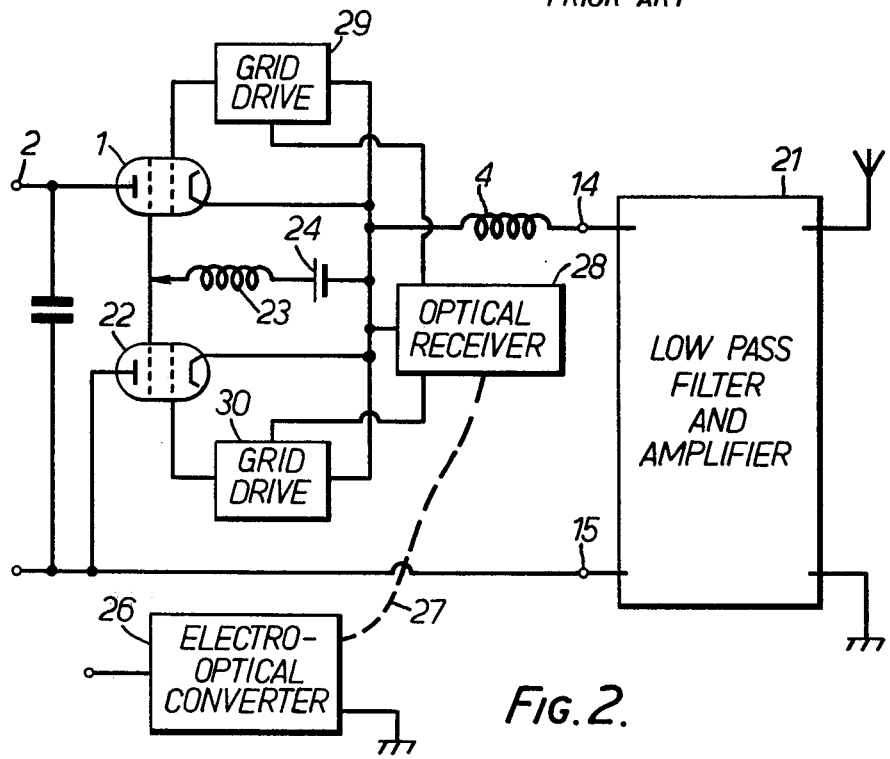

The invention is further described, by way of example, with reference to the accompanying drawings in which, FIG. 1 illustrates a known amplitude modulation circuit utilising a pulse width modulator, FIG. 2 illustrates a amplitude modulation circuit utilising a pulse width modulator in accordance with the present invention, and FIGS. 3, 4, 5 and 6 show possible modifications of part of the circuit shown in FIG. 2.

Referring to FIG. 1, a switchable tetrode tube 1 is connected to a terminal 2 at which is applied a source of H.T. potential, typically 25 kV. The cathode of the tetrode 1 is connected to the cathode of a diode 3 and also via an inductor 4 to a low pass filter 5. The output of the low pass filter 5 is fed to an r.f. amplifier stage 6 consisting of a further tetrode tube 7 in series with an inductor 8. The purpose of the circuit is to provide an amplitude modulation of a carrier frequency which is fed at a very high power level to a radiating antenna 9. The carrier frequency is applied to the grid electrode of the tetrode tube 7. The incoming audio frequency signal is suitably encoded in a pulse width modulation form (by means not shown) using a sampling or chopping frequency which is much higher than the highest audio frequency. The coded signal is amplified and applied to the control grid electrode 10 of the first tetrode 1. This causes a high level pulse width modulation waveform of amplitude substantially equal to the H.T. supply voltage present at terminal 2 to appear across the inductor 4 which re-constitutes the pulse width modulation waveform into a high level audio signal. The low pass filter 5 further removes undesirable signal components from the audio signal which is then presented to the r.f. amplifier 6 whose maximum amplitude swing is from zero volts (earth) to the level of the H.T. supply voltage less any losses produced within the tetrode tube 1 and other series components. A capacitor 11 is connected across the output terminals of the H.T. supply source.

The diode 3 may be a conventional diode having only an anode and a cathode or, alternatively, it may be a tube having a control grid which is permanently biassed into the conductive state so that it conducts whenever a forward voltage is applied to it. This state normally occurs whenever the tetrode tube 1 is non-conductive. The re-constituted audio waveform flows as a current through the inductor 4 continuously and this current flows through the tetrode tube 1 whenever it is conductive and through the diode 3 whenever the tetrode tube 1 is non-conductive. Although this audio frequency current is determined by the pulse width modulation switching action of the tetrode tube 1, the instantaneous amplitude and phase of the current is controlled by the inductor 4 and the low pass filter 5. While the tetrode tube 1 and the diode 3 are in their conductive state they must be biassed in readiness to pass the peak value of the audio frequency current flowing through the inductor 4 plus any ripple and transient signals associated with the high frequency pulse width modulation chopping waveform.

It is convenient to use a tetrode tube in place of the diode 3 so that tubes having similar characteristics can be used throughout the circuit and if the tubes have been economically chosen for this application they will have little reserve of peak current capability and will, therefore, require positive screen electrode and control grid electrode voltages close to their maximum permissible ratings in order to pass the peak current at low anode-cathode voltage which is necessary for high efficiency and low distortion. While the peak anode current is flowing, the currents drawn by the screen electrode 12 and control grid electrode 10 will be fairly low. If the screen and control grid electrodes are maintained at full positive voltage levels when the anode current is substantially less than its maximum peak value, the excess cathode emission drawn by the two electrodes, but not now required by the anode circuit, will flow, principally, to the screen electrode. As the tubes operate for most of the time at substantially less than peak anode current, this condition gives rise to serious over-dissipation in the screen circuit and is unacceptable.

Referring to FIG. 2, there is shown therein a circuit in accordance with the present invention and it will be seen that the basic circuit layout is very similar to that shown in FIG. 1, but the low pass filter 5 and the amplifier 6 have, for convenience, been combined in a single block 21. The tetrode tube 1 is connected via the inductor 4 as previously to the low pass filter, but the diode 3 is now provided by an additional tetrode tube 22 which is connected in parallel with the input terminals 14 and 15 of the low pass filter. The tetrode tubes 1 and 22 share a common screen electrode bias circuit which is constituted by an inductor 23 in series with a voltage source 24, typically about 500 volts. The grid control waveform ideally consists of a pulse width modulation signal having approximately 100 nS edges and because the mark-space ratio of the pulse width modulation waveform can vary from 0 to 100 percent under varying conditions of modulation, the grid drive system requires a bandwidth extending down to the lowest audio frequencies to be used, typically 30 Hz. The grid drive signal must be coupled from the low voltage generating circuits which generate the pulse width modulation waveform to the tube deck which is being switched between earth and the H.T. level applied at terminal 2. The tube deck is that of the circuitry associated with the tetrode tubes 1 and 22 which operate at substantially cathode potential. The pulse width modulation grid drive signal is applied to an electro-optical converter 26 which includes a device such as a light emitting diode which produces a modulated optical signal in accordance with the pulse width modulation signal applied to the converter. An optical fibre 27 transfers the optically modulated signal to an optical receiver 28 which is at the cathode potential of the two tetrode tubes 1 and 22. By this means the grid drive circuits 29 and 30 are electrically isolated from earth. The optical receiver 28 contains circuitry which provides signals in mutual antiphase to the grid drive circuits 29 and 30 so that one tetrode tube is conductive while the other is non-conductive and vice-versa. The grid drive circuits 29 and 30, themselves, merely provide the required degree of voltage drive amplification. The mark-space ratio of the signal applied to the grids from the electro-optical converter 26 can be set to determine the overall power level of the signal transmitted by the output r.f. amplifier by controlling the average mark-space ratio of the pulse width modulation signal.

The use of the optical isolation enables the cathode-to-earth capacitance to be kept to an absolute minimum. The presence of undesirable cathode-to-earth capacitance significantly distorts the re-constituted audio signal provided by the inductor 4 and the low pass filter and it is important to minimise this as far as is possible.

The screen drive circuit constituted by the inductor 23 and the voltage source 24 provided a particularly economical circuit since, as the two tetrode tubes 1 and 22 are driven in anti-phase by the two grid drive circuits 29 and 30, the screen bias current is automatically diverted to whichever of the two tetrode tubes is, for the time being, in conduction.

Figure 3:
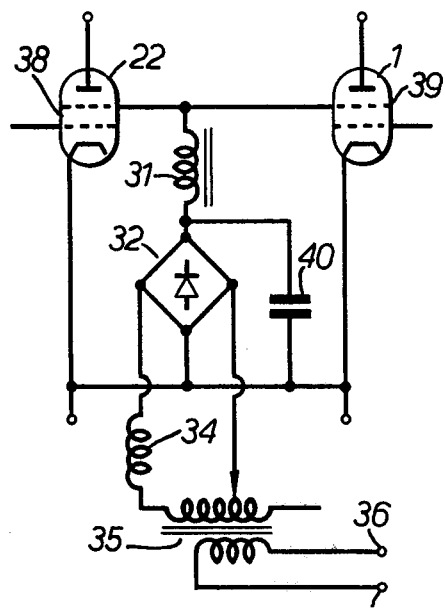
Figure 4:
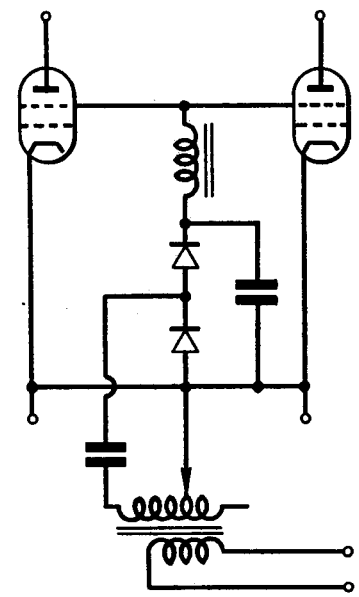

FIGS. 3 and 4 show in greater detail alternative forms of the screen drive circuit which produces a substantially constant bias current for screen electrodes 38 and 39. In FIG. 3 an inductor 31 is connected to a rectifying diode bridge network 32, and an additional inductor 34 is provided between the network 32 and a transformer 35. The transformer 35 could conveniently be connected via terminals 36, 37 to the filament transformer required for the tetrode tubes. The inductor 34 provides additional current stabilisation which may be desirable while the anode current of the conductive tetrode tube is small.

In FIG. 4 a voltage doubling circuit is shown, and this is capable of providing a substantially lossless controlled current output. In both FIGS. 3 and 4, a capacitor 40 can be provided, and tappings on the transformer can be used to adjust the initial current level. Additionally, in both cases, a small series resistor can be connected directly at each screen electrode, to prevent parasitic oscillation or reduce the effects of tube arc.

Figure 5:
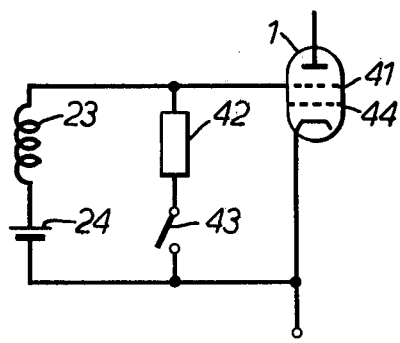

A modified screen electrode bias circuit is shown in FIG. 5 which could be used if tetrode tube 1 were used alone. The tetrode tube 1 has a screen grid 41 connected to an inductor 23 and a voltage source 24, as in the circuit shown in FIG. 2. In this case, an additional shunt circuit consisting of a switch 43 and an impedance 42 is connected between cathode potential and the screen electrode 41. When the tetrode tube 1 is rendered non-conductive by means of a suitable grid drive signal applied to the grid electrode 44 the switch 43 is closed, thereby providing a low impedance shunt path for the excessive voltage which would otherwise develop across the inductor 23 under these conditions.

Figure 6:
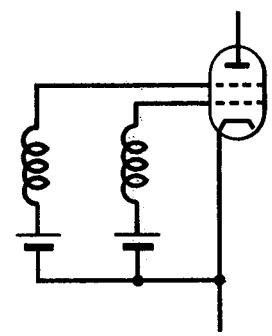

If the other tetrode tube 22 were used alone to perform the duty of the diode 3, the arrangement of FIG. 6 may be employed to apply suitable and substantially constant bias currents to both screen and grid electrodes, to provide adequate forward conductivity between anode and cathode without over-dissipation at either screen or grid electrodes. The voltage sources and inductors at screen and grid electrodes, shown in FIG. 6, may be replaced by bias supplies as in FIGS. 3 or 4 to give improved control of bias currents if desired. Additional series resistances may also be employed. Since, for diode duty, this tetrode need not be controlled at the grid to render it non-conductive, no additional switch corresponding to switch 43 of FIG. 5 is necessary.

I claim:

1. A modulation circuit including a pulse width modulation switch in the form of a switchable tube having a grid electrode to which, in operation, is applied a pulse width modulation control signal and a screen electrode; means for applying a substantially constant bias current to said screen electrode for those periods during which the tube is rendered conductive by the application of a suitable control signal to the grid electrode; and a low pass filter connected between said switchable tube and an output terminal of the modulation circuit to attenuate frequencies at the switching frequency of said control signal.

2. A modulation circuit as claimed in claim 1 and wherein the switchable tube is a tetrode.

3. A modulation circuit as claimed in claim 1 or 2 and wherein a further switchable device is connected in parallel with a pair of input terminals of said low pass filter, and which is arranged to provide a shunt path for current in said low pass filter when said pulse width modulation switch is non-conductive.

4. A modulation circuit as claimed in claim 3 and wherein the further switchable device is a tetrode tube having a grid electrode to which, in operation, a signal is applied in anti-phase to the pulse width modulation control signal.

5. A modulation circuit as claimed in claim 4 and wherein the two tetrode tubes have a common current source means for providing a bias current for their respective screen electrodes.

6. A modulation circuit as claimed in claim 5 and wherein said common current source means comprises an inductor in series with a source of potential.

7. A modulation circuit as claimed in claim 2 wherein the cathode of said tetrode is arranged to be switched between earth potential and an H.T. potential under the action of the pulse width modulation control signal which is applied to the grid electrode of said tetrode, the grid drive circuit which applies the control signal to the grid electrode being electrically isolated from the earth potential by means of an optical coupler which couples said control signal to said grid drive circuit.

8. A modulation circuit as claimed in claim 7 and wherein the optical coupler comprises an electro-optical transducer and an opto-electrical transducer coupled by an electrically insulating optical fibre.

* * * * *